(12) United States Patent
Meng et al.

(10) Patent No.: US 11,970,591 B2
(45) Date of Patent: Apr. 30, 2024

(54) RESIN COMPOSITION, PREPREG FOR PRINTED CIRCUIT AND METAL-COATED LAMINATE

(71) Applicant: Shengyi Technology Co., Ltd., Guangdong (CN)

(72) Inventors: Yundong Meng, Guangdong (CN); Kehong Fang, Guangdong (CN)

(73) Assignee: Shengyi Technology Co., Ltd., Guangdong (CN)

( * ) Notice: Subject to any disclaimer, the term of this patent is extended or adjusted under 35 U.S.C. 154(b) by 312 days.

(21) Appl. No.: 17/287,911

(22) PCT Filed: Dec. 25, 2018

(86) PCT No.: PCT/CN2018/123417
§ 371 (c)(1),
(2) Date: Apr. 22, 2021

(87) PCT Pub. No.: WO2020/132859
PCT Pub. Date: Jul. 2, 2020

(65) Prior Publication Data
US 2021/0403659 A1   Dec. 30, 2021

(51) Int. Cl.
C08J 5/24         (2006.01)
B32B 5/02         (2006.01)
B32B 15/14        (2006.01)
B32B 15/20        (2006.01)
C08L 9/00         (2006.01)
C08L 9/06         (2006.01)
C08L 71/12        (2006.01)
C08L 83/16        (2006.01)
H05K 1/03         (2006.01)

(52) U.S. Cl.
CPC ............... *C08J 5/244* (2021.05); *B32B 5/02* (2013.01); *B32B 15/14* (2013.01); *B32B 15/20* (2013.01); *C08L 9/00* (2013.01); *C08L 9/06* (2013.01); *C08L 71/12* (2013.01); *C08L 83/16* (2013.01); *H05K 1/0366* (2013.01); *B32B 2250/03* (2013.01); *B32B 2250/40* (2013.01); *B32B 2260/021* (2013.01); *B32B 2260/046* (2013.01); *B32B 2262/101* (2013.01); *B32B 2264/1021* (2020.08); *B32B 2307/3065* (2013.01); *B32B 2457/08* (2013.01); *C08J 2309/00* (2013.01); *C08J 2309/06* (2013.01); *C08J 2371/12* (2013.01); *C08J 2383/16* (2013.01); *C08J 2409/00* (2013.01); *C08J 2409/06* (2013.01); *C08J 2471/12* (2013.01); *C08J 2483/16* (2013.01); *C08L 2201/02* (2013.01); *C08L 2203/20* (2013.01); *C08L 2205/03* (2013.01); *H05K 2201/029* (2013.01)

(58) Field of Classification Search
CPC .... C08L 9/00; C08L 9/06; C08L 71/12; C08L 83/16; C08L 2201/02; C08L 2205/03; B32B 2307/3065; C08J 2309/00; C08J 2309/06; C08J 2371/12; C08J 2383/16; C08J 2409/00; C08J 2409/06; C08J 2471/12; C08J 2483/16
See application file for complete search history.

(56) References Cited

U.S. PATENT DOCUMENTS

2014/0044918 A1* 2/2014 Zeng ................ C08L 71/126
                                                    524/508

FOREIGN PATENT DOCUMENTS

| CN | 102807658 A  | 12/2012 |            |
|----|--------------|---------|------------|
| EP | 0000385 B1   | 8/1981  |            |
| EP | 0617073 A2   | 9/1994  |            |
| EP | 2695916 A1 * | 2/2014  | B32B 27/04 |

OTHER PUBLICATIONS

International Search Report in connection with PCT Application No. PCT/CN2018/123417.

* cited by examiner

*Primary Examiner* — Ling Siu Choi
*Assistant Examiner* — Andrea Wu
(74) *Attorney, Agent, or Firm* — Norton Rose Fulbright US LLP; James R. Crawford

(57) ABSTRACT

Provided is a resin composition, a prepreg for a printed circuit and a metal-coated laminate. The resin composition includes: a silicone aryne resin, a polyphenylene ether resin with unsaturated bonds, and a butadiene polymer. The resin composition is used such that the prepared metal-coated laminate can have at least one of the following characteristics: a low dielectric loss factor, high heat resistance, and a low coefficient of thermal expansion.

19 Claims, No Drawings

RESIN COMPOSITION, PREPREG FOR PRINTED CIRCUIT AND METAL-COATED LAMINATE

This application is a national phase under 35 U.S.C. § 371 of International Application No. PCT/CN2018/123417 filed on Dec. 25, 2018, which is hereby incorporated by reference in its entirety.

TECHNICAL FIELD

The present disclosure relates to the technical field of printed circuit boards. Specifically, the present disclosure relates to a resin composition, a prepreg for printed circuits and a metal-clad laminate.

BACKGROUND

The metal-clad laminate is a plate-shaped material made by impregnating electronic glass fiber cloth or other reinforcing materials with resin liquid, and covering one or both sides with metal foil and hot pressing. It is called a metal foil-clad laminate, referred to as metal-clad laminate, e.g., copper-clad laminate (CCL). Metal-clad laminates, such as copper-clad laminates, are base laminate materials used to manufacture printed circuit boards (PCBs) which are one of the important components in the electronics industry. Almost every kind of electronic equipment, including from electronic watches and calculators to computers, communication electronic equipment, and military weapon systems, requires printed boards for electrical interconnection therebetween, as long as there are electronic components such as integrated circuits. The metal-clad laminate is mainly responsible for the functions of conduction, insulation and support on the entire printed circuit board.

With the rapid development of electronic equipment towards miniaturization, multi-function, high performance and high reliability, printed circuit boards are required to develop faster in the direction of high precision, high density, high performance, microporosity and thinness. The CCL determines the performance of the PCB to a large extent.

The development trend of high-precision, high-density, high-performance, microporous, thin and multilayer printed circuit boards requires metal clad laminates such as copper clad laminates to have higher thermal and mechanical properties. For example, multi-layer boards are applied in more and more electronic products. In order to ensure the stable and reliable performance of multi-layer circuit boards, it is necessary for laminates to have characteristics such as low dielectric loss factor, high heat resistance, and low coefficient of thermal expansion.

SUMMARY

One object of the present disclosure is to provide a resin composition, a prepreg for printed circuits obtained by impregnating a reinforcing material such as glass fiber cloth with the resin composition, and a metal-clad laminate comprising the prepreg for printed circuits, allowing the metal-clad laminate to have at least one of the characteristics of low dielectric loss factor, high heat resistance, low coefficient of thermal expansion, etc.

Another object of the present disclosure is to provide an insulating board comprising the prepreg for printed circuits, and a printed circuit board comprising the prepreg for printed circuits, the insulating board, or the metal-clad laminate, wherein the insulating board or the metal-clad laminate has one of the characteristics of low dielectric loss factor, high heat resistance, low coefficient of thermal expansion, etc.

Therefore, in one aspect, the present disclosure provides a resin composition, comprising
 a silicon-containing arylacetylene resin;
 a polyphenylene ether resin with unsaturated bonds; and
 a butadiene polymer,
 wherein the silicon-containing arylacetylene resin, the polyphenylene ether resin with unsaturated bonds and the butadiene polymer have a weight ratio of (1-95):(5-70):(5-70).

According to one embodiment of the present disclosure, the silicon-containing arylacetylene resin is represented by the following formula:

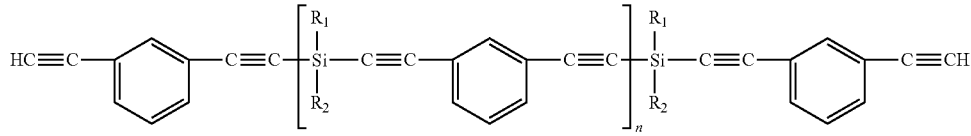

wherein
 n is an integer between 1 and 5; and
 $R_1$ and $R_2$ are each independently a group selected from the group consisting of hydrogen, $C_{1-6}$ alkyl or $C_{3-6}$ cycloalkyl.

According to one embodiment of the present disclosure, the silicon-containing arylacetylene resin has a number average molecular weight of 250 to 10,000.

According to one embodiment of the present disclosure, the polyphenylene ether resin with unsaturated bonds is a polyphenylene ether resin containing unsaturated double bonds in the end groups or side chains, and has a molecular backbone chain structure as shown below:

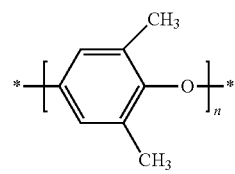

wherein n is an integer that allows the polyphenylene ether resin with unsaturated bonds to have a number average molecular weight of 1,000 to 7,000.

According to one embodiment of the present disclosure, the butadiene polymer is selected from butadiene homopolymers, butadiene copolymers, or a combination thereof.

According to one embodiment of the present disclosure, the butadiene copolymer is selected from any one or a mixture of at least two of polybutadiene homopolymer, styrene-butadiene copolymer, hydrogenated diene-butadiene-styrene copolymer, maleic anhydride diene-butadiene-styrene copolymer, styrene-butadiene-styrene copolymer, styrene-isoprene-styrene copolymer, styrene-butadiene-divinylbenzene copolymer, and maleic anhydride styrene-butadiene copolymer.

According to one embodiment of the present disclosure, the content of the 1,2-vinyl group in the side chain of the butadiene polymer is 18% by weight or more.

According to one embodiment of the present disclosure, the butadiene polymer has a number average molecular weight in the range of 1,000 to 10,000.

According to one embodiment of the present disclosure, the resin composition further comprises an accelerator, wherein the content of the accelerator in the resin composition is 0.01 to 5% by weight.

According to one embodiment of the present disclosure, the accelerator is selected from any one or a mixture of at least two of peroxides, metal salts of acetylacetone, metal salts of naphthenic acid, vanadium pentoxide, amines, quaternary ammonium salts, imidazoles and triphenylphosphine.

According to one embodiment of the present disclosure, the resin composition further comprises a filler.

According to one embodiment of the present disclosure, the filler is selected from any one or a mixture of at least two of alumina, titanium oxide, mica, silica, beryllium oxide, barium titanate, potassium titanate, strontium titanate, calcium titanate, aluminum carbonate, magnesium hydroxide, aluminum hydroxide, aluminum silicate, calcium carbonate, calcium silicate, magnesium silicate, silicon nitride, boron nitride, clays such as calcined clay, talc, aluminum borate and silicon carbide.

According to one embodiment of the present disclosure, the resin composition further comprises a flame retardant.

According to one embodiment of the present disclosure, the resin composition further comprises a solvent.

In another aspect, the present disclosure provides a prepreg for printed circuits, comprising a reinforcing material and the resin composition as described in any one of the above items that is attached to the reinforcing material after impregnation and drying.

In another aspect, the present disclosure provides an insulating board, comprising at least one prepreg for printed circuits as described above.

In another aspect, the present disclosure provides a metal-clad laminate, comprising at least one prepreg for printed circuit as described above and a metal foil.

In another aspect, the present disclosure provides a printed circuit board, comprising: at least one prepreg for printed circuits as described above, or at least one insulating board as described above, or at least one metal-clad laminate as described above.

According to the present disclosure, there can be provided a resin composition, a prepreg for printed circuits obtained by impregnating a reinforcing material with the resin composition, and a metal-clad laminate or insulating board comprising the prepreg for printed circuits, as well as a printed circuit board comprising the prepreg for printed circuits, the insulating board or the metal-clad laminate, so that the metal-clad laminate can have at least one of the characteristics of low dielectric loss factor, high heat resistance, low coefficient of thermal expansion, etc.

DETAILED DESCRIPTION

The technical solutions of the present disclosure will be clearly and completely illustrated by specific embodiments below. Obviously, the described embodiments and/or examples are only a part of the embodiments and/or examples of the present disclosure, rather than all the embodiments and/or examples. Based on the embodiments and/or examples in the present disclosure, all other embodiments and/or all other examples obtained by those of ordinary skill in the art without inventive work fall within the protection scope of the present disclosure.

In the following description, layers and films can be used interchangeably. The resin composition is sometimes also referred to as an adhesive hereinafter.

In the present disclosure, all numerical features refer to within the error range of the measurement, for example, within ±10%, or ±5%, or ±1% of the limited value.

The "comprising", "including" or "containing" as mentioned in the present disclosure means that in addition to the specified components, other components which impart different characteristics to the prepreg may also be included. In addition, the "comprising", "including" or "containing" as mentioned in the present disclosure may also include "essentially consisting of", and may be replaced with "is/are" or "consisting of".

In the present disclosure, amounts and ratios are measured by weight, if not specifically indicated.

In the present disclosure, a resin composition containing a solvent may also be referred to as a resin varnish.

As described above, the present disclosure provides a resin composition, comprising:
a silicon-containing arylacetylene resin;
a polyphenylene ether resin with unsaturated bonds; and
a butadiene polymer,
wherein the silicon-containing arylacetylene resin, the polyphenylene ether resin with unsaturated bonds and the butadiene polymer have a weight ratio of (1-95):(5-70):(5-70).

Silicon-Containing Arylacetylene Resin

The silicon-containing arylacetylene resin may be a resin containing silicon, benzene ring and alkyne structure in the molecular backbone chain.

The silicon-containing arylacetylene resin may be represented by the following formula:

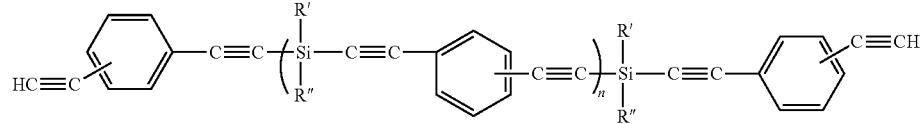

wherein
n is an integer between 1 and 5; and
R' and R" are each independently a group selected from the group consisting of hydrogen, $C_{1-6}$ alkyl or $C_{3-6}$ cycloalkyl.

Preferably, the silicon-containing arylacetylene resin can be represented by the following formula

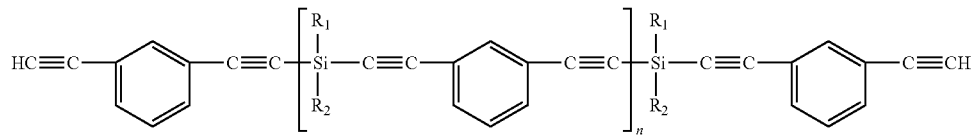

wherein
n is an integer between 1 and 5; and
$R_1$ and $R_2$ are each independently a group selected from the group consisting of hydrogen, $C_{1-6}$ alkyl or $C_{3-6}$ cycloalkyl.

In the above formulas, two alkynyl groups on the benzene ring may be at ortho-, meta- or para-positions. The silicon-containing arylacetylene resin can be obtained by polymerizing diethynylbenzene and dichlorosilane. For example, it can be obtained by polymerizing diethynylbenzene and dichlorosilane via a Grignard reaction.

Examples of diethynylbenzene may include 1,2-diethynylbenzene, 1,3-diethynylbenzene, and 1,4-diethynylbenzene.

Examples of dichlorosilane may include R'R"SiCl$_2$, or $R_1R_2SiCl_2$, wherein R', R", $R_1$, and $R_2$ are each independently a group selected from the group consisting of hydrogen, $C_{1-6}$ alkyl or $C_{3-6}$ cycloalkyl.

Specific examples of dichlorosilane may include methyldichlorosilane and dichlorodimethylsilane.

Examples of $C_{1-6}$ alkyl may include methyl, ethyl, n-propyl, isopropyl, n-butyl, isobutyl, tert-butyl, various pentyl groups, and various hexyl groups. Examples of $C_{3-6}$ cycloalkyl may include cyclopropyl, cyclobutyl, cyclopentyl, and cyclohexyl.

The silicon-containing arylacetylene resin may have a number average molecular weight of about 250 to 10,000, preferably about 500 to 2,000. Silicon-containing arylacetylene resins with a low molecular weight are easier to be dissolved in solvents, and have better compatibility with polyphenylene ether resins containing unsaturated bonds, which can reduce the risk of resin precipitation and phase separation, and is beneficial to better form an interpenetrating network structure. However, silicon-containing arylacetylene resins having a too low molecular weight will result in a too long reaction time, which is not conducive to the curing process of the resin system.

The proportion by weight of the silicon-containing arylacetylene resin in the resin composition has a significant effect on the flame retardant properties of the resin composition. When the proportion by weight of the silicon-containing arylacetylene resin to the sum of the silicon-containing arylacetylene resin, polyphenylene ether resin containing unsaturated bonds and butadiene polymer is greater than 75%, the system can achieve flame retardant grade V-0 without the use of a flame retardant.

Polyphenylene Ether Resin with Unsaturated Bonds

The polyphenylene ether resin with unsaturated bonds can be a polyphenylene ether resin containing unsaturated double bonds in the end groups or side chains, and has a molecular backbone chain structure as shown below:

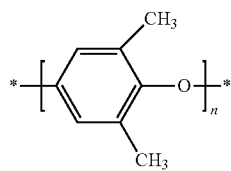

wherein n is an integer that allows the polyphenylene ether resin with unsaturated bonds to have a number average molecular weight of 1,000 to 7,000.

The unsaturated double bonds contained in the end groups or side chains of the polyphenylene ether resin containing unsaturated bonds can be cured and crosslinked, so as to form a crosslinked cured product.

Polyphenylene ether resins containing unsaturated bonds are generally prepared by replacing the hydrogen atoms on the end groups or side chains of polyphenylene ether resins such as polyphenylene ether resins having a low molecular weight with a compound containing unsaturated double bonds. The polyphenylene ether resin containing unsaturated bonds may be liquid or solid at room temperature. The molecular weight of the polyphenylene ether resin containing unsaturated bonds affects its processing technology and the performance of the final crosslinked cured product. The larger the molecular weight is, the greater the viscosity of the unsaturated bonds containing-polyphenylene ether resin liquid or of the solution of the unsaturated bonds containing-polyphenylene ether resin liquid or solid in a solvent, the fewer the reactive groups, and the worse the compatibility with other components; the smaller the molecular weight is, the lower the viscosity of the unsaturated bonds containing-polyphenylene ether resin liquid or the solution of the unsaturated bonds containing-polyphenylene ether resin liquid or solid in a solvent, the more the reactive groups, and the better the compatibility with other components. However, if the molecular weight is too small, the dielectric properties and toughness of the crosslinked cured product will be damaged. Therefore, the number average molecular weight of the polyphenylene ether resin containing unsaturated double bonds is about 1,000 to 7,000, and preferably about 1,000 to 4,000.

The polyphenylene ether resin containing unsaturated bonds is mainly used in the resin composition to improve the cohesiveness and toughness of the resin composition. Too low an amount is not enough to improve the peel strength and interlayer adhesion of metal clad laminates such as copper clad laminates; and too high an amount of the polyphenylene ether resin containing unsaturated bonds will decrease the glass transition temperature. Moreover, the dielectric properties of polyphenylene ether resins containing unsaturated bonds are inferior to those of silicon-containing arylacetylene resins and butadiene polymers, and therefore, the dielectric constant and dielectric loss of metal clad laminates such as copper clad laminates will be increased when the amount is too high.

Butadiene Polymer

The butadiene polymer is selected from butadiene homopolymers, butadiene copolymers or a combination thereof.

The examples of the butadiene copolymer may include any one or a mixture of at least two of styrene-butadiene copolymer, hydrogenated diene-butadiene-styrene copolymer, maleic anhydride diene-butadiene-styrene copolymer, styrene-butadiene-styrene copolymer, styrene-isoprene-styrene copolymer, styrene-butadiene-divinylbenzene copolymer and maleic anhydride styrene-butadiene copolymer.

In order to ensure the curing performance of the resin composition, the content of the 1,2-vinyl group on the side chain of the polymer is preferably about 18% by weight or more, more preferably 30% by weight or more.

In order to ensure the curing performance of the resin composition and the dielectric properties of the cured product, as well as the fluidity of the prepreg, the number average molecular weight of the butadiene polymer may be in the range of about 1,000 to 10,000.

The butadiene polymer has good dielectric properties, but poor cohesiveness and flame retardancy. Its role in the resin composition is to increase the fluidity of the silicon-containing arylacetylene resin and weaken the crystallization of the silicon-containing arylacetylene resin. When the amount is too low, it is not enough to show its effect. However, when the amount is too high, it will reduce the peel strength of metal-clad laminates such as copper clad laminates and deteriorate the flame retardancy.

Accelerator

Optionally, the resin composition further comprises an accelerator to meet the needs of different curing conditions.

In the case where an accelerator is contained, the content of the accelerator in the above resin composition may be about 0.01 to 5% by weight.

The accelerator can be selected from any one or a mixture of at least two of peroxides, metal salts of acetylacetone, metal salts of naphthenic acid, vanadium pentoxide, amines, quaternary ammonium salts, imidazoles, and triphenylphosphine.

Examples of peroxides may include dicumyl peroxide, tert-butyl cumyl peroxide, di-tert-butyl peroxide, tert-butylperoxy isopropyl carbonate, 2,5-dimethyl-2,5-di-tert-butylcumylperoxyhexyne-3, 2,5-dimethyl-2,5-di-tert-butylperoxyhexane, p-menthane peroxide, 1,1-bis(tert-pentylperoxy)cyclohexane, diisopropylbenzene hydroperoxide, benzoyl peroxide or benzoyl peroxide derivatives. Examples of amines may include aniline.

The metal in the metal salts of acetylacetone and the metal salts of naphthenic acid may independently be an alkali metal, alkaline earth metal, or transition metal, for example, potassium, calcium, sodium, magnesium, aluminum, zinc, iron, cobalt, ect.

In order to better adapt to processing techniques such as dipping, a solvent may be added to the resin composition to reduce the resin viscosity during the dipping process.

The solvent is not particularly limited, but one or more types of aromatic hydrocarbon-containing solvents are preferred. As specific examples of the aromatic hydrocarbon solvent, toluene, xylene, mesitylene, etc., are preferably used. These aromatic hydrocarbon solvents may be used alone or in combination of two or more.

In addition, if an aromatic hydrocarbon solvent is contained, other solvents can be further used in combination. The combined solvent is not particularly limited. Specific examples include: alcohols such as methanol, ethanol, and butanol; ethers such as ethyl cellosolve, butyl cellosolve, ethylene glycol monomethyl ether, carbitol, and butyl carbitol; ketones such as acetone, methyl ethyl ketone, methyl isobutyl ketone, and cyclohexanone; esters such as methoxy ethyl acetate, ethoxyethyl acetate, butoxyethyl acetate, and ethyl acetate; nitrogen-containing solvents such as N,N-dimethylformamide, N,N-dimethylacetamide, and N-methyl-2-pyrrolidone. These solvents can be used alone or in combination of two or more. In addition, when the aromatic hydrocarbon solvent is combined with other solvents to make a mixed solvent, the aromatic hydrocarbon solvent is preferably 50% by weight or more of the total solvent.

In the case where a solvent is contained, the content of the solvent in the resin composition may be 10-99.5% by weight, preferably about 20-99% by weight.

In order for the metal-clad laminate made from the resin composition to have better modulus and heat resistance, a filler such as an inorganic filler may be added to the resin composition.

The filler is not particularly limited. Specifically, alumina, titanium oxide, mica, silica, beryllium oxide, barium titanate, potassium titanate, strontium titanate, calcium titanate, aluminum carbonate, magnesium hydroxide, aluminum hydroxide, aluminum silicate, calcium carbonate, calcium silicate, magnesium silicate, silicon nitride, boron nitride, clays such as calcined clay, talc, aluminum borate, silicon carbide, and the like can be used. These may be used alone or in combination of two or more. The shape thereof is not particularly limited, but a spherical shape is preferred. There are certain restrictions on the particle size of the filler. The particle size is preferably 0.01 to 30 μm, more preferably 0.1 to 15 μm.

When the particle size of the filler is 0.01 μm or less, the fluidity of the resin composition decreases. As a result, the moldability during the production of prepregs and metal-clad laminates deteriorates, easily resulting in voids or large surface area. As a result, the bonding area between the metal and resin reduces, resulting in a decrease in the peel strength of the printed wiring board. Therefore, such particle size is not preferable. On the other hand, when the particle size exceeds 30 μm, the insulation reliability of the wirings or insulating layers of the printed wiring board will decrease. Therefore, such particle size is not preferable.

In the case where a filler is contained, the content of the filler in the resin composition may be about 1 to 90% by weight, preferably about 5 to 80% by weight.

In order to better meet the requirements such as flame retardancy, a flame retardant may also be added to the resin composition.

As the flame retardant, flame retardants such as bromine-based, phosphorus-based, and metal hydroxide flame retardants are preferably used.

Examples of bromine-based flame retardants are brominated additive flame retardants such as brominated epoxy resins such as brominated bisphenol A-type epoxy resins and brominated phenol novolac epoxy resins, hexabromobenzene, pentabromotoluene, ethylenebis(pentabromophenyl), ethylenebistetrabromophthalimide, 1,2-dibromo-4-(1,2-dibromoethyl)cyclohexane, tetrabromocyclooctane, hexabromocyclododecane, bis(tribromophenoxy)ethane, brominated polyphenylene ether, brominated polystyrene, and 2,4,6-tris(tribromophenoxy)-1,3,5-triazine; and brominated reactive flame retardants containing unsaturated double bond groups, such as tribromophenyl maleimide, tribromophenyl acrylate, tribromophenyl methacrylate, tetrabromobisphenol A-type dimethacrylate, pentabromobenzyl acrylate and brominated styrene.

Examples of phosphorus-based flame retardants are aromatic phosphate esters such as triphenyl phosphate, tricresyl phosphate, tris(xylenyl)phosphate, cresyl diphenyl phosphate, cresyl bis-2,6-xylenyl phosphate, and resorcinol bis(diphenylphosphate); phosphonates such as divinyl phenylphosphonate, diallyl phenylphosphonate, and bis(1-butenyl) phenylphosphonate; phosphate esters such as phenyl diphenylphosphonate, methyl diphenylphosphonate, and 9,10-dihydro-9-oxa-10-phosphaphenanthrene-10-oxide derivatives; phosphazene compounds such as bis(2-allylphenoxy)phosphazene and dicresylphosphazene; melamine phosphate, melamine pyrophosphate, melamine polyphosphate, melam polyphosphate, ammonium polyphosphate, phosphorus-containing vinylbenzyl compounds and red phosphorus.

Examples of metal hydroxide flame retardants are magnesium hydroxide or aluminum hydroxide.

In addition, the above flame retardants may be used alone or in combination of two or more.

In the case where a flame retardant is contained, the content of the flame retardant in the resin composition may be about 1 to 60% by weight, preferably about 2 to 40% by weight.

In addition, the resin composition may further contain various auxiliary agents. Specific examples of auxiliary agents include filler dispersants, defoamers, antioxidants, heat stabilizers, antistatic agents, ultraviolet absorbers, pigments, colorants, lubricants and the like. These auxiliaries can be used alone or as a mixture of any two or more.

The resin composition of the present disclosure can be prepared by well-known methods such as compounding, stirring, and mixing silicon-containing arylacetylene resins, polyphenylene ether resins containing unsaturated bonds and butadiene polymers, and optionally any one or a mixture of at least two of accelerators, solvents, fillers, flame retardants, dispersants, defoamers, antioxidants, heat stabilizers, antistatic agents, ultraviolet absorbers, pigments, colorants and lubricants.

Through mechanical stirring, emulsification or ball milling dispersion, the resin composition is formulated into a resin varnish. Then a reinforcing material is impregnated with the resin varnish, and dried to obtain a prepreg. The prepreg and a metal foil such as a copper foil or an aluminum foil may be hot pressed in a vacuum press to prepare a metal-clad laminate.

Examples of the reinforcing material may include glass fiber cloth, glass fiber non-woven fabric, and organic non-woven fabric, and the like.

In order to reduce the viscosity of the resin varnish, the impregnation can be carried out with heating. Heating is performed so as to make the temperature of the resin varnish lower than the boiling point of the solvent used. Preferably, the temperature of the resin varnish during impregnation is about 20-90° C., further preferably about 25-55° C.

In another aspect, the present disclosure may further provide a prepreg for printed circuits, comprising a reinforcing material, and the resin composition as described in any one of the above items that is attached to the reinforcing material after impregnation and drying.

In another aspect, the present disclosure may further provide an insulating board or a metal-clad laminate, comprising at least one prepreg for printed circuits as described above.

In another aspect, the present disclosure may further provide a printed circuit board, comprising at least one prepreg for printed circuits as described above, or at least one insulating board as described above, or at least one metal-clad laminate as described above.

According to the present disclosure, there can be provided a resin composition, a prepreg for printed circuits obtained by impregnating a reinforcing material with the resin composition, and a metal-clad laminate or insulating board containing the prepreg for printed circuits, and a printed circuit board including the prepreg for printed circuits, the insulating board, or the metal-clad laminate, so that the metal-clad laminate can have at least one of the characteristics of low dielectric loss factor, high heat resistance, low coefficient of thermal expansion and the like.

EXAMPLES

The technical solutions of the present disclosure will be further described below through specific embodiments. However, these examples are to illustrate the present disclosure, and should not be construed as limiting the present disclosure.

Preparation Examples

The silicon-containing arylacetylene resins used in the examples and comparative examples were prepared as follows.

Into a reactor filled with nitrogen were added 3.5 parts of magnesium powder (chemically pure, Shanghai Sinopharm Chemical Reagent Co., Ltd.), and 40 parts of tetrahydrofuran (THF) as a solvent, stirred at room temperature, and added dropwise a mixed solution of 13.5 parts of bromoethane (chemically pure, Shanghai Sinopharm Chemical Reagent Co., Ltd.) and 40 parts of THF. After the dropwise addition was completed, the reaction was kept at 50° C. for 1 hour. Then, under the condition of an ice-water cooling bath, a mixture of 7.5 parts of 1,3-diethynylbenzene (Shandong Jiaozhou Fine Chemical Co., Ltd.) and 40 parts of THF solvent was added dropwise. After the dropwise addition was completed, the reaction was kept at 65° C. for 1 hour, and then cooled again. Under the condition of an ice-water cooling bath, a mixture of 5.5 parts of dichlorodimethylsilane (chemically pure, Zhejiang Xin'an Chemical Group Co., Ltd., used after distillation) and 40 ml THF was added dropwise. After the dropwise addition was completed, the reaction was kept at 40° C. and 70° C. for 1 h separately. After the reaction was completed, the THF in the reaction was distilled off. A mixture of 7.2 parts of glacial acetic acid and 50 parts of toluene solvent was added dropwise under the condition of an ice-water cooling bath, and thoroughly stirred. Then 140 parts of 2.0% dilute hydrochloric acid aqueous solution were added dropwise, thoroughly stirred to separate the upper organic phase. The organic phase was thoroughly washed with water to neutrality, then dried, filtered and distilled to remove toluene, to obtain a silicon phenylalkyne resin (i.e. the silicon-containing arylacetylene resin used in the examples and comparative examples (having a number average molecular weight of 1,200, where THF was used as the mobile phase in GPC test), hereinafter referred to as PSA1200).

Examples 1-8 and Comparative Examples 1-4

According to the amount (parts by weight) shown in Tables 1 or 2, the silicon-containing arylacetylene resin, polyphenylene ether resin containing unsaturated bonds and butadiene polymer, as well as the accelerator were thoroughly dissolved in the solvent, and mixed well. Then an inorganic filler and/or flame retardant were/was added and mixed evenly to obtain a varnish. A 1080 E-type glass fiber cloth (manufactured by Nittobo) was evenly impregnated with the above varnish, and baked in a blast oven at 155° C. for 3 minutes to prepare a prepreg. 4 or 8 sheets of the above prepregs were respectively laminated, covered with 18 μm reversed copper foil (produced by Suzhou Futian Metal Co., Ltd.) on both top and bottom sides, and pressed in a vacuum hot press at a pressure of pressure 3 MPa and a temperature of 210° C. for 90 minutes to obtain laminate samples of two thicknesses (hereinafter, sometimes referred to as copper clad laminates) (i.e. 8*1080 HH laminate samples and 4*1080 HH laminate samples).

The amount of the components in the resin composition and the test results of the resin composition are shown in Tables 1 and 2 below. The coefficient of thermal expansion, thermal expansion ratio and thermal stress were tested with 8*1080 HH laminate samples, and the others were tested with 4*1080 HH laminate samples.

TABLE 1

|  |  | Example 1 | Example 2 | Example 3 | Example 4 | Example 5 | Example 6 |
|---|---|---|---|---|---|---|---|
| Silicon-containing arylacetylene resin | PSA1200 | 50 | 50 | 120 | 20 | 50 | 50 |
| Polyphenylene ether resin with unsaturated bonds | SA9000 | 50 | 50 | 10 | 40 | 30 | 30 |
|  | OPE-2St |  |  |  |  |  |  |
| Butadiene polymer | Ricon100 | 50 |  |  |  | 50 | 50 |
|  | Ricon181 |  | 50 |  |  |  |  |
|  | Ricon257 |  |  | 20 |  |  |  |
|  | B1000 |  |  |  |  | 20 | 20 |
|  | B3000 |  |  |  | 90 |  |  |
| Accelerator | DCP |  | 0.2 |  | 0.2 | 0.2 | 0.2 |
|  | 1 part of cobalt acetylacetonate and 1.5 parts of triphenyl-phosphine in ethanol |  |  | 0.5 |  |  |  |
| Filler | DQ1028L | 230 |  |  |  |  |  |
|  | SC2050 |  | 200 | 200 | 200 | 190 | 200 |
| Flame retardant | BT-93w |  |  |  |  | 40 | 0 |
|  | XP7866 |  |  |  |  |  | 45 |
|  | Aluminum hydroxide |  |  |  |  |  |  |
| Solvent | Toluene | 150 | 150 | 150 | 150 | 180 | 180 |
| Glass transition temperature (Tg)° C. |  | >230 | >230 | >230 | >230 | >230 | >230 |
| Thermal decomposition temperature (Td) |  | 440 | 450 | >500 | 410 | 390 | 420 |
| Peel strength (PS) N/mm |  | 0.6 | 0.6 | 0.6 | 0.6 | 0.8 | 0.8 |
| 10 GHz dielectric constant (Dk) |  | 3.7 | 3.7 | 3.9 | 3.6 | 3.7 | 3.7 |
| 10 GHz dielectric loss factor (Df) |  | 0.0035 | 0.0032 | 0.0039 | 0.0032 | 0.0032 | 0.0032 |
| Flame retardancy |  | V-1 | V-1 | V-0 | V-1 | V-0 | V-0 |
| Coefficient of thermal expansion (ppm/° C.) |  | 40 | 40 | 35 | 40 | 40 | 40 |
| Thermal expansion ratio at 50-260° C. (%) |  | 1.5 | 1.5 | 1.2 | 1.5 | 1.5 | 1.5 |
| Thermal stress (min) |  | >10 | >10 | >10 | >10 | >10 | >10 |

TABLE 2

|  |  | Example 7 | Example 8 | Comp. Example 1 | Comp. Example 2 | Comp. Example 3 | Comp. Example 4 |
|---|---|---|---|---|---|---|---|
| Silicon-containing arylacetylene resin | PSA1200 | 50 | 50 | 50 | 50 |  | 150 |
| Polyphenylene ether resin with unsaturated bonds | SA9000 | 30 |  | 100 |  | 100 |  |
|  | OPE-2St |  | 30 |  |  |  |  |
| Butadiene polymer | Ricon100 | 50 | 50 |  | 100 |  | 50 |
|  | Ricon181 |  |  |  |  |  |  |
|  | Ricon257 |  |  |  |  |  |  |
|  | B1000 | 20 | 20 |  |  |  |  |
|  | B3000 |  |  |  |  |  |  |
| Accelerator | DCP | 0.2 | 0.2 | 0.2 | 0.2 | 0.2 |  |
|  | 1 part of cobalt acetylacetonate and 1.5 parts of triphenyl-phosphine in ethanol |  |  |  |  |  | 0.5 |
| Filler | DQ1028L | 200 | 200 |  |  |  |  |
|  | SC2050 |  |  | 200 | 200 | 200 | 200 |
| Flame retardant | BT-93w | 0 | 0 | 40 | 40 | 40 | 40 |
|  | XP7866 | 30 | 30 |  |  |  |  |
|  | Aluminum hydroxide | 20 | 20 |  |  |  |  |
| Solvent | Toluene | 180 | 180 | 180 | 180 | 180 | 180 |
| Glass transition temperature (Tg)° C. |  | >230 | >230 | 170 | >230 | 200 | >230 |
| Thermal decomposition temperature (Td) |  | 420 | 420 | 400 | 410 | 390 | >500 |
| Peel strength (PS) N/mm |  | 0.8 | 0.8 | 0.3 | 0.1 | 0.2 | 0.2 |
| 10 GHz dielectric constant (Dk) |  | 3.7 | 3.7 | 4.2 | 4 | 3.9 | 4.5 |
| 10 GHz dielectric loss factor (Df) |  | 0.0032 | 0.0032 | 0.0045 | 0.004 | 0.0045 | 0.0045 |
| Flame retardancy |  | V-0 | V-0 | V-0 | V-0 | V-0 | V-0 |

TABLE 2-continued

|  | Example 7 | Example 8 | Comp. Example 1 | Comp. Example 2 | Comp. Example 3 | Comp. Example 4 |
|---|---|---|---|---|---|---|
| Coefficient of thermal expansion (ppm/° C.) | 40 | 40 | 60 | 50 | 50 | 32 |
| Thermal expansion ratio at 50-260° C. (%) | 1.5 | 1.5 | 2.9 | 2.4 | 2.4 | 1.1 |
| Thermal stress (min) | >10 | >10 | >10 | >10 | >10 | >10 |

PSA1200: the silicon-containing arylacetylene resin obtained in the preparation example;
SA9000: Allyl-modified polyphenylene ether resin, produced by SABIC;
Ricon100: butadiene-styrene copolymer having a number average molecular weight of 4,500 and a side chain vinyl content of 70% by weight, produced by CRAYVALLEY;
Ricon181: butadiene-styrene copolymer having a number average molecular weight of 3,200 and a side chain vinyl content of 20-40% by weight, produced by CRAYVALLEY;
Ricon257: butadiene-styrene-divinylbenzene branched terpolymer having a number average molecular weight of 5,300 and a side chain vinyl content of 30-50% by weight, produced by CRAYVALLEY;
B1000: butadiene homopolymer having a number average molecular weight of about 1,200 and a side chain vinyl content of 85% by weight, produced by NISSO, Japan;
B3000: butadiene homopolymer having a number average molecular weight of about 3,200 and a side chain vinyl content of 92% by weight, produced by NISSO, Japan;
DCP: dicumyl peroxide, a reagent;
1 part of cobalt acetylacetonate and 1.5 parts of triphenylphosphine in 100 parts of ethanol: the amount in the table refers to the amount of cobalt acetylacetonate and triphenylphosphine, that is, 0.5 parts by weight refers to 0.2 parts by weight of cobalt acetylacetonate and 0.3 parts by weight of triphenylphosphine;
DQ1028L: spherical silica having D50 of about 3.0 μm, produced by Jiangsu Lianrui;
SC2050: spherical silica having D50 of about 0.5 μm, provided by Toyota Tsusho;
BT-93w: an additive bromine-based flame retardant, produced by Albemarle, USA;
XP7866: an additive phosphorus-based flame retardant, produced by Albemarle, USA;
Aluminum hydroxide: OL-104, produced by Albemarle, USA;
Toluene: an industrial product, commercially available The methods for testing the performance described in the table are as follows:

1) Glass transition temperature Tg: tested using dynamic thermomechanical analysis (DMA), in accordance with the DMA test method specified in IPC-TM-6502.4.24;

2) Thermal decomposition temperature (Td): tested using thermogravimetic analysis (TGA), in accordance with the standard IPC-TM-650 2.4.24.6;

3) Peel strength (PS): referring to the tensile force required to peel one millimeter of copper foil off the copper clad laminate at room temperature;

4) Dielectric constant (Dk) and dielectric loss factor (Df): measured at 10 GHz with a split post dielectric resonator (SPDR), in accordance with the standard IPC-TM-650 2.5.5.5.

5) Flame retardancy: tested in accordance with UL94 "50 W (20 mm) vertical burning test: V-0, V-1 and V-2" test method, where V-0 was recognized as flame retardant.

6) Coefficient of thermal expansion (CTE) and thermal expansion ratio at 50-260° C.: tested using a thermomechanical analyzer (TMA) in accordance with the standard IPC-TM-650 2.4.24. Both the coefficient of thermal expansion (CTE) and thermal expansion ratio at 50-260° C. were measured in the length direction of the laminate sample.

7) Thermal stress: the copper clad laminate was floated on the surface of molten tin at a temperature of 288° C., and the time of delamination or bubbles was recorded as the test result.

8) D50: representing average particle size, which refers to the particle size at the point of being exactly equivalent to 50% volume in the cumulative particle size distribution curve calculated by taking the total volume of the particles as 100%. It was measured using the particle size distribution determination based on a laser diffraction/scattering method.

It can be seen from the test results of the examples and the comparative examples above that the test results of the Tg and Td of the samples in all examples were higher than those of the printed circuit boards commonly used in the industry. The dielectric loss factor results of copper clad laminates show that they will have good application performance in high-frequency and high-speed laminates, and they have excellent CTE, thermal expansion ratio at 50-260° C. and thermal stress.

As compared with the examples, Comparative Example 1, where no butadiene copolymer resin was employed, showed low dielectric loss and large expansion coefficient; Comparative Example 2, where no polyphenylene ether resin containing unsaturated double bonds was employed, showed obviously too low peel strength to meet the requirements for the use of copper clad laminates; Comparative Example 3, where no silicon-containing arylacetylene resin was employed, showed large dielectric loss and large expansion coefficient; and, Comparative Example 4, which was a single resin system of silicon-containing arylacetylene, showed a small coefficient of expansion but a large dielectric constant.

As above, it is possible to provide a resin composition, a prepreg for printed circuits obtained by impregnating a glass fiber cloth with the resin composition, and a metal-clad laminate or insulating board containing the prepreg for printed circuit, and a printed circuit board containing the prepreg for printed circuits, the insulating board or the metal-clad laminate, so that the metal-clad laminate can at least have one of the characteristics of low dielectric loss factor, high heat resistance, low coefficient of thermal expansion, etc., preferably have low dielectric loss factor, high heat resistance and low coefficient of thermal expansion at the same time. Meanwhile, by adding a flame retardant, flame retardant grade V-0 can be achieved, making it suitable for applications requiring flame retardancy.

Obviously, those skilled in the art can make various changes and modifications to the embodiments of the present disclosure without departing from the spirit and scope of the present disclosure. In this way, if these modifications and variations of the present disclosure fall within the scope of the claims of the present disclosure and their equivalent technologies, the present disclosure also intends to include these modifications and variations.

What is claimed:

1. A resin composition, comprising:
a silicon-containing arylacetylene resin,
a polyphenylene ether resin with unsaturated bonds; and
a butadiene polymer;

wherein the silicon-containing arylacetylene resin, the polyphenylene ether resin with unsaturated bonds and the butadiene polymer have a weight ratio of (1-95):(5-70):(5-70);

wherein the silicon-containing arylacetylene resin is represented by the following formula:

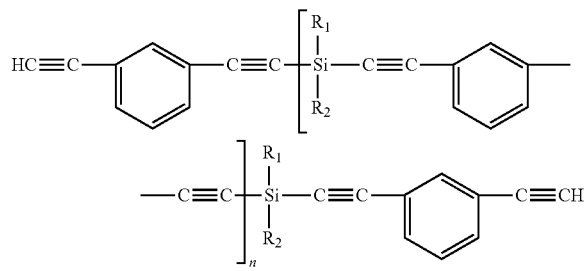

wherein
n is an integer between 1 and 5; and
$R_1$ and $R_2$ are each independently a group selected from the group consisting of hydrogen, $C_{1-6}$ alkyl or $C_{3-6}$ cycloalkyl.

2. The resin composition according to claim 1, wherein the silicon-containing arylacetylene resin has a number average molecular weight of 250 to 10,000.

3. The resin composition according to claim 1, wherein the polyphenylene ether resin with unsaturated bonds is a polyphenylene ether resin containing unsaturated double bonds in the end groups or side chains, and has a molecular backbone chain structure as shown below:

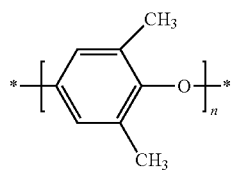

wherein n is an integer that allows the polyphenylene ether resin with unsaturated bonds to have a number average molecular weight of 1,000 to 7,000.

4. The resin composition according to claim 1, wherein the butadiene polymer is selected from butadiene homopolymers, butadiene copolymers or a combination thereof.

5. The resin composition according to claim 4, wherein the butadiene copolymer is selected from any one or a mixture of at least two of polybutadiene homopolymer, styrene-butadiene copolymer, hydrogenated diene-butadiene-styrene copolymer, maleic anhydride diene-butadiene-styrene copolymer, styrene-butadiene-styrene copolymer, styrene-isoprene-styrene copolymer, styrene-butadiene-divinylbenzene copolymer and maleic anhydride styrene-butadiene copolymer.

6. The resin composition according to claim 1, wherein the content of the 1,2-vinyl group in the side chain of the butadiene polymer is 18% by weight or more.

7. The resin composition according to claim 1, wherein the butadiene polymer has a number average molecular weight in the range of 1,000 to 10,000.

8. The resin composition according to claim 1, further comprising an accelerator, wherein the content of the accelerator in the resin composition is 0.01 to 5% by weight.

9. The resin composition according to claim 8, wherein the accelerator is selected from any one or a mixture of at least two of peroxides, metal salts of acetylacetone, metal salts of naphthenic acid, vanadium pentoxide, amines, quaternary ammonium salts, imidazoles and triphenylphosphine.

10. The resin composition according to claim 1, further comprising a filler.

11. The resin composition according to claim 10, wherein the filler is selected from any one or a mixture of at least two of alumina, titanium oxide, mica, silica, beryllium oxide, barium titanate, potassium titanate, strontium titanate, calcium titanate, aluminum carbonate, magnesium hydroxide, aluminum hydroxide, aluminum silicate, calcium carbonate, calcium silicate, magnesium silicate, silicon nitride, boron nitride, clays such as calcined clay, talc, aluminum borate and silicon carbide.

12. The resin composition according to claim 1, further comprising a flame retardant.

13. The resin composition according to claim 1, further comprising a solvent.

14. A prepreg for printed circuits, comprising a reinforcing material, and the resin composition according to claim 1 that is attached to the reinforcing material after impregnation and drying.

15. A metal-clad laminate, comprising at least one prepreg for printed circuits according to claim 14 and a metal foil.

16. A prepreg for printed circuits, comprising a reinforcing material, and the resin composition according to claim 1 that is attached to the reinforcing material after impregnation and drying.

17. A prepreg for printed circuits, comprising a reinforcing material, and the resin composition according to claim 2 that is attached to the reinforcing material after impregnation and drying.

18. The resin composition according to claim 10, wherein the filler comprises at least two of the members selected from the group consisting of alumina, titanium oxide, mica, silica, beryllium oxide, barium titanate, potassium titanate, strontium titanate, calcium titanate, aluminum carbonate, magnesium hydroxide, aluminum hydroxide, aluminum silicate, calcium carbonate, calcium silicate, magnesium silicate, silicon nitride, boron nitride, clays, talc, aluminum borate and silicon carbide.

19. The resin composition according to claim 10, wherein the filler is selected from the group consisting of alumina, titanium oxide, mica, silica, beryllium oxide, barium titanate, potassium titanate, strontium titanate, calcium titanate, aluminum carbonate, magnesium hydroxide, aluminum hydroxide, aluminum silicate, calcium carbonate, calcium silicate, magnesium silicate, silicon nitride, boron nitride, a clay, talc, aluminum borate and silicon carbide.

* * * * *